United States Patent
Kim et al.

(10) Patent No.: US 8,649,238 B2
(45) Date of Patent: Feb. 11, 2014

(54) SEMICONDUCTOR MEMORY DEVICE AND METHOD OF CONTROLLING THE SAME

(75) Inventors: Dong-Min Kim, Seoul (KR);
Young-Soo Sohn, Seoul (KR);
Seung-Jun Bae, Hwaseong-si (KR);
Kwang-Il Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 186 days.

(21) Appl. No.: 13/078,218

(22) Filed: Apr. 1, 2011

(65) Prior Publication Data

US 2011/0242924 A1    Oct. 6, 2011

Related U.S. Application Data

(60) Provisional application No. 61/320,567, filed on Apr. 2, 2010.

(30) Foreign Application Priority Data

Sep. 13, 2010    (KR) .................. 10-2010-0089397

(51) Int. Cl.
*G11C 8/00*    (2006.01)

(52) U.S. Cl.
USPC .................................... 365/230.03

(58) Field of Classification Search
USPC .................................... 365/230.03
See application file for complete search history.

(56) References Cited

U.S. PATENT DOCUMENTS

| 2004/0230767 A1* | 11/2004 | Bland et al. ............. 711/203 |
| 2006/0117155 A1 | 6/2006 | Ware et al. |
| 2007/0186030 A1* | 8/2007 | Harrand et al. ............ 711/5 |
| 2009/0303808 A1* | 12/2009 | Park ......................... 365/193 |

FOREIGN PATENT DOCUMENTS

| KR | 10-0335486 | 10/2000 |
| KR | 10-2010-0006871 | 1/2010 |

* cited by examiner

*Primary Examiner* — Hoai V Ho
*Assistant Examiner* — Min Huang
(74) *Attorney, Agent, or Firm* — Onello & Mello, LLP

(57) ABSTRACT

A semiconductor memory device includes a memory cell array, an address control unit and a logic circuit. The memory cell array includes a plurality of banks which are divided into a first bank block and a second bank block. The address control unit accesses the memory cell array. The logic circuit controls the address control unit based on a command and an address signal such that the first and second bank blocks commonly operate in a first operation mode, and the first and second bank blocks individually operate in a second operation mode.

18 Claims, 12 Drawing Sheets

| RISING CK | BA3 | BA2 | BA1 | BA0 | A12 | A11 | A10 | A9 | A8 |
|---|---|---|---|---|---|---|---|---|---|
| RISING /CK | A3 | A4 | A5 | A2 | (RFU) | A6 | A0 | A1 | A7 |

FIG. 8

|  | 512M | | 1G | | 2G | |
|---|---|---|---|---|---|---|
|  | X32 MODE | X16 MODE | X32 MODE | X16 MODE | X32 MODE | X16 MODE |
| RADD | A0~A11 | A0~A11 | A0~A11 | A0~A11 | A0~A12 | A0~A12 |
| CADD | A0~A5 | A0~A6 | A0~A5 | A0~A6 | A0~A5 | A0~A6 |
| BADD | BA0~BA2 | BA0~BA2 | BA0~BA3 | BA0~BA3 | BA0~BA3 | BA0~BA3 |

FIG. 9

| BANK | ADDRESSING | | | | 512M | 1G | 2G |
|---|---|---|---|---|---|---|---|
|  | BA3 | BA2 | BA1 | BA0 | 8 BANKS | 16 BANKS | 16 BANKS |
| 0 | 0 | 0 | 0 | 0 | GPA | GPA | GPA |
| 1 | 0 | 0 | 0 | 1 | GPA | GPA | GPA |
| 2 | 0 | 0 | 1 | 0 | GPB | GPA | GPA |
| 3 | 0 | 0 | 1 | 1 | GPB | GPA | GPA |
| 4 | 0 | 1 | 0 | 0 | GPC | GPB | GPB |
| 5 | 0 | 1 | 0 | 1 | GPC | GPB | GPB |
| 6 | 0 | 1 | 1 | 0 | GPD | GPB | GPB |
| 7 | 0 | 1 | 1 | 1 | GPD | GPB | GPB |
| 8 | 1 | 0 | 0 | 0 |  | GPC | GPC |
| 9 | 1 | 0 | 0 | 1 |  | GPC | GPC |
| 10 | 1 | 0 | 1 | 0 |  | GPC | GPC |
| 11 | 1 | 0 | 1 | 1 |  | GPC | GPC |
| 12 | 1 | 1 | 0 | 0 |  | GPD | GPD |
| 13 | 1 | 1 | 0 | 1 |  | GPD | GPD |
| 14 | 1 | 1 | 1 | 0 |  | GPD | GPD |
| 15 | 1 | 1 | 1 | 1 |  | GPD | GPD |

SEMICONDUCTOR MEMORY DEVICE AND METHOD OF CONTROLLING THE SAME

CROSS-REFERENCE TO RELATED APPLICATION(S)

This US non-provisional application claims the benefit of priority under 35 USC §119 to U.S. Provisional Application No. 61/320,567 filed on Apr. 2, 2010 in the USPTO, and Korean Patent Application No. 10-2010-0089397 filed on Sep. 13, 2010 in the Korean Intellectual Property Office (KIPO), the contents of which applications are herein incorporated by reference in their entirety.

BACKGROUND OF THE INVENTION

1. Technical Field

Exemplary embodiments relate to semiconductor devices, and more particularly to semiconductor memory devices and methods of controlling the same.

2. Description of the Related Art

Semiconductor memory devices such as DRAMs perform various operations under the control of a memory controller. In recently developed multimedia devices, an amount of data to be processed has increased, and the required speed of processing the data has increased. As the operating speed of the semiconductor memory devices increases, more frequent accesses to a memory core, such as a memory cell array, are required.

SUMMARY OF THE INVENTION

The inventive concept is provided to substantially obviate one or more drawbacks due to limitations and disadvantages of the related art.

Some exemplary embodiments provide a semiconductor memory device capable of providing relatively fast operating speed.

Some exemplary embodiments provide a method of controlling the semiconductor memory device.

According to one aspect, the inventive concept is directed to a semiconductor memory device which includes a memory cell array, an address control unit and a logic circuit. The memory cell array includes a plurality of banks which are divided into a first bank block and a second bank block. The address control unit accesses the memory cell array. The logic circuit controls the address control unit based on a command and an address signal such that the first and second bank blocks commonly operate in a first operation mode and the first and second bank blocks individually operate in a second operation mode.

In some embodiments, the logic circuit may control the address control unit such that the first and second bank blocks receive a same internal address signal decoded from the address signal to operate as designated by the command in the first operation mode.

In some embodiments, the logic circuit may control the address control unit such that the first and second bank blocks receive individual first and second internal address signals decoded from the address signal, respectively, to operate as designated by the command in the second operation mode.

In some embodiments, each of the first and second bank blocks may be divided into at least two groups in response to the command and the address signal, and the first and second bank blocks operate in one same mode of a group mode and a non-group mode in the first operation mode, and wherein each of the first and second bank blocks may be accessible in units of a group in the group mode, and each of the first and second bank blocks is accessible in units of the bank in the non-group mode.

In some embodiments, when the first and second bank blocks operate in the group mode, each of consecutive accesses to banks in the same group may be enabled by a time gap.

In some embodiments, when the first and second bank blocks operate in the group mode, each of consecutive accesses to banks in the different groups may be enabled without a time gap.

In some embodiments, each of the first and second bank blocks may be individually divided into at least two groups in response to the command and the address signal, and each of the first and second bank blocks operates in one respective mode of a group mode and a non-group mode in the second operation mode, and wherein each of the first and second bank blocks is accessible in units of a group in the group mode, and each of the first and second bank blocks is accessible in units of the bank in the non-group mode.

When the first and second bank blocks operate in the group mode, each of consecutive accesses to banks in the same group may be enabled by a time gap.

In some embodiments, first column access time is at least two times as long as a second column access time, and wherein the first column access time is associated with a column access time when at least one of the first and second bank blocks operates in the group mode, and the second column access time is associated with a column access time when at least one of the first and second bank blocks operates in the non-group mode.

In some embodiments, the logic circuit may include a command decoder that decodes the command to provide a mode register set (MRS) command and a mode register that generates first and second mode control signals for controlling the address control unit, in response to the MRS command and the address signal.

The first mode control signal may determine operation modes of the first and second bank blocks, and the second mode control signal determines group modes of the first and second bank blocks.

The mode register may store first to fourth bank address codes and first to thirteenth address codes.

The operation mode may be determined according to a logic level of the thirteenth address code.

A group mode or a non-group mode of the first and second bank blocks may be determined according to logic levels of the eleventh and twelfth address codes.

In some embodiments, the address control unit may include an address decoder that decodes the address signal into an internal address signal, an address multiplexer that multiplexes the internal address signal in response to the first and second mode control signals, and a decoder unit that accesses the first and second bank blocks according to the first and second mode control signals in response to the multiplexed internal address signal.

According to another aspect, the inventive concept is directed to a method of controlling a semiconductor memory device. The method includes dividing a memory cell array into first and second bank blocks, each bank block including a plurality of banks. The method further includes, in a first operation mode, accessing commonly the first and second bank blocks in response to a command and an address signal. The method further includes, in a second operation mode, accessing individually the first and second bank blocks in a second operation mode in response to the command and the address signal.

According to another aspect, the inventive concept is directed to a semiconductor memory device comprising a memory cell array, an address control unit and a logic circuit. The memory cell array includes a plurality of banks, the banks being divided into a first bank block and a second bank block. The address control unit accesses the memory cell array. The logic circuit is configured to control the address control unit based on a command and an address signal such that the first and second bank blocks commonly operate in a first operation mode, and the first and second bank blocks individually operate in a second operation mode. The logic circuit comprises a command decoder that decodes the command to provide a mode register set (MRS) command and a mode register that generates first and second mode control signals for controlling the address control unit, in response to the MRS command and the address signal, the mode register storing a plurality of bank address codes and a plurality of address codes. The address control unit comprises an address decoder that decodes the address signal into an internal address signal, an address multiplexer that multiplexes the internal address signal in response to the first and second mode control signals, and a decoder unit that accesses the first and second bank blocks according to the first and second mode control signals in response to the multiplexed internal address signal.

In some embodiments, the mode register stores first to fourth bank address codes and first to thirteenth In some embodiments, the operation mode is determined according to a logic level of the thirteenth address code. In some embodiments, a group mode or a non-group mode of the first and second bank blocks is determined according to logic levels of the eleventh and twelfth address codes.

The semiconductor memory device may individually group the bank blocks according to the operation mode, and thus timing margin for the column access operation may be increased.

BRIEF DESCRIPTION OF THE DRAWINGS

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the inventive concept.

FIG. 4 illustrates the operation of the bank blocks when the first mode control signal designates the first operation mode, and FIG. 5 illustrates the operation of the bank blocks when the first mode control signal designates the second operation mode.

FIG. 8 is a table illustrating an addressing scheme of the semiconductor memory device of FIG. 1 according to possible density, according to some exemplary embodiments of the inventive concept.

FIG. 9 is a table illustrating the bank groups according to the possible density, according to some exemplary embodiments of the inventive concept.

DETAILED DESCRIPTION

Figure 1:
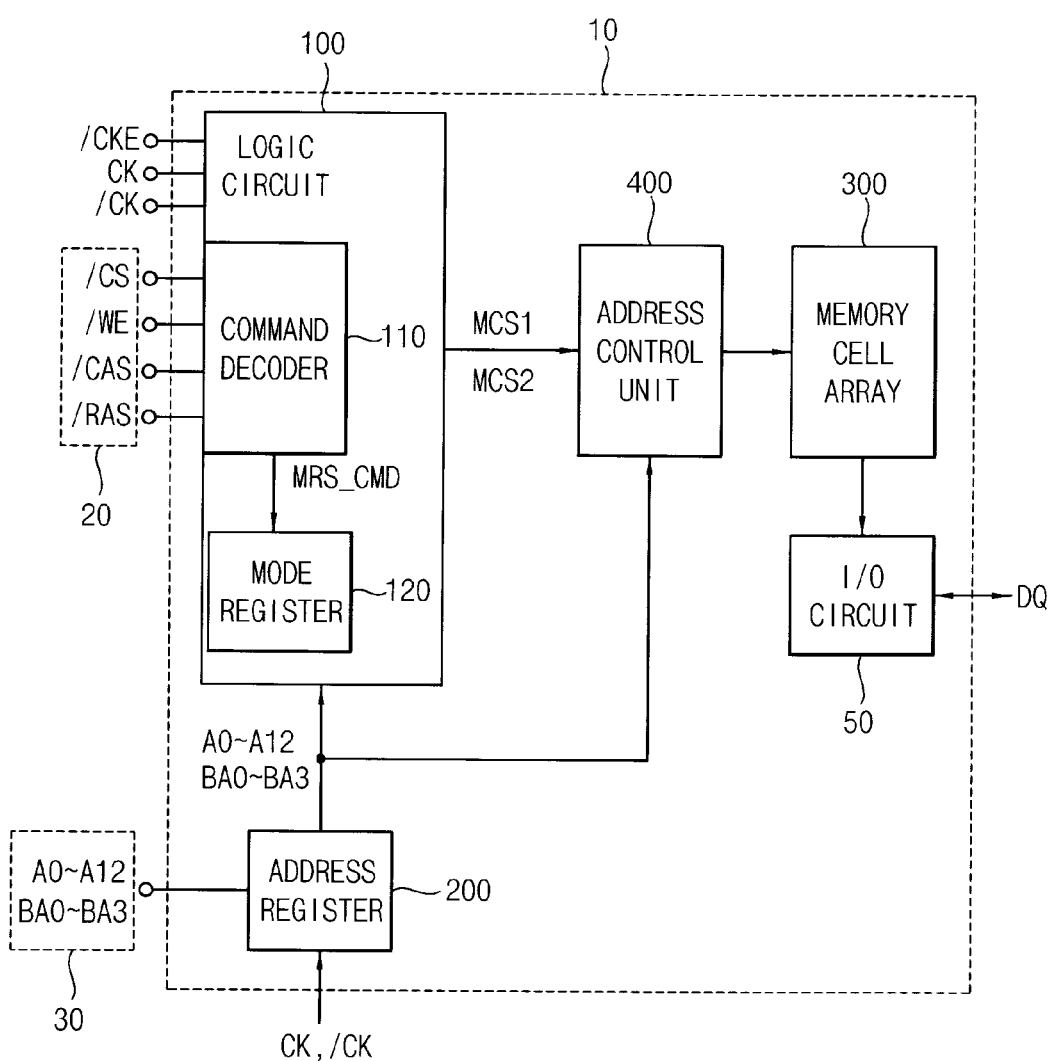
FIG. 1 is a schematic block diagram illustrating a semiconductor memory device according to some exemplary embodiments of the inventive concept.

Various exemplary embodiments will be described in detail hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this description will be thorough and complete, and will fully convey the present inventive concept to those skilled in the art. In the drawings, the sizes and relative sizes of layers and regions may be exaggerated for clarity. Like numerals refer to like elements throughout.

It will be understood that, although the terms first, second, third, etc., may be used herein to describe various elements, these elements should not be limited by these terms. These terms are used to distinguish one element from another. Thus, a first element described below could be referred to as a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 is a schematic block diagram illustrating a semiconductor memory device according to some exemplary embodiments. Referring to FIG. 1, in one exemplary embodiment, the semiconductor memory device 10 is constructed and arranged to include a logic circuit 100, an address register 200, an address control unit 400, a memory cell array 300 and an input/output (I/O) circuit 50.

Figure 2:
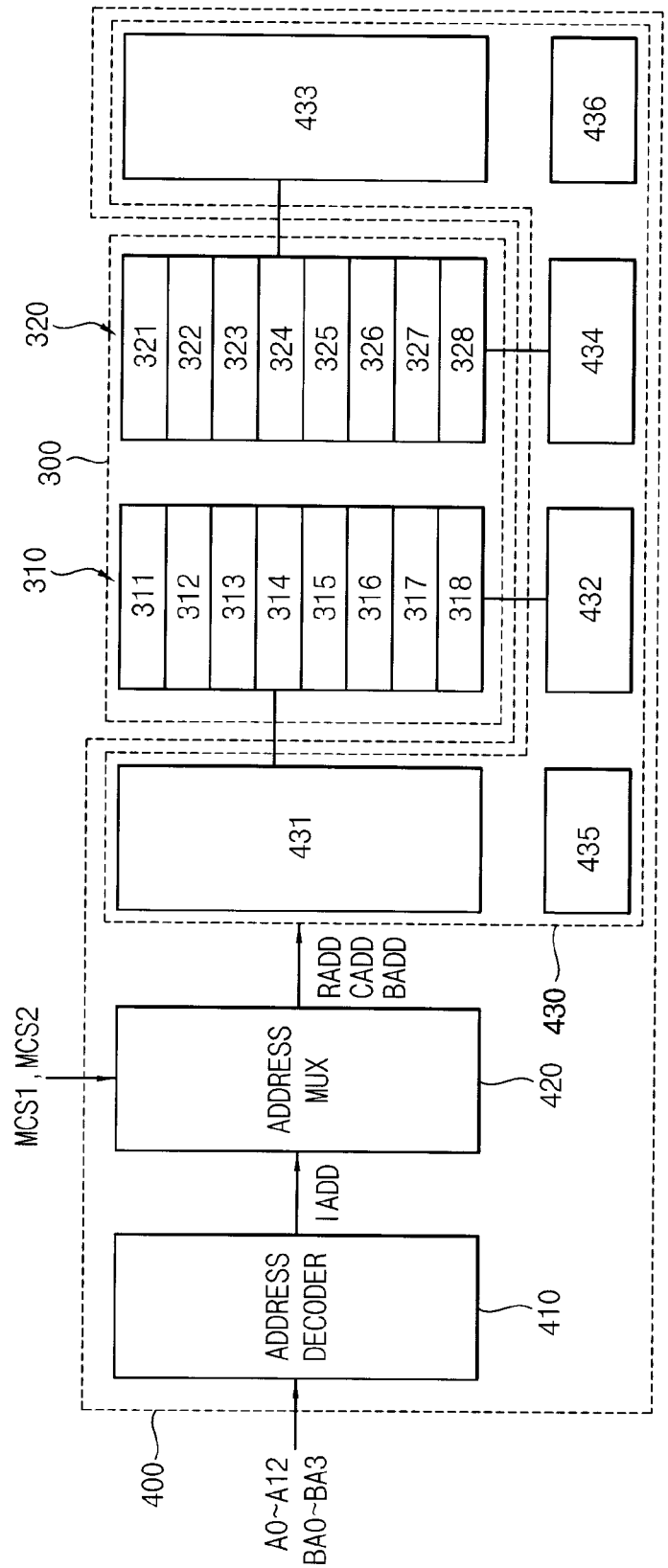
FIG. 2 is a schematic block diagram illustrating the memory cell array and the address control unit in FIG. 1 according to some exemplary embodiments the inventive concept.

The logic circuit 100 is adapted to receive control signals 20 and an address signal 30, which are illustrated in FIG. 1 in dashed-line boxes. The logic circuit 100 controls the address control unit 400, which accesses the memory cell array 300 based on a command and the address signal. In some exemplary embodiments, the control signals 20 include a chip select signal /CS, a write enable signal /WE, a column address strobe signal /CAS and a row address strobe signal /RAS The address signal 30 includes A0~A12 and BA0~BA3. The combination of the control signals /CS, /WE, /CAS and /RAS collectively designates the command. In some embodiments, the memory cell array 300 may include a first bank block 310 and a second bank block 320, which are described in detail with reference to FIG. 2. Referring to FIGS. 1 and 2, the first bank block 310 includes a plurality of banks 311~318, and the second bank block 320 includes another plurality of banks 321~328. The logic circuit 100 controls the address control unit 400 based on the command and the address signal A0~A12 and BA0~BA3 such that the first and second bank blocks 310 and 320 can commonly operate in a first operation mode, and the first and second bank blocks 310 and 320 can individually operate in a second operation mode. In addition, the logic circuit 100 may also receive a clock enable signal /CKE, a clock signal CK and an inverted clock signal /CK.

Continuing to refer to FIG. 1, the address register 200 receives the address signal 30 and the clock signal CK or the inverted clock signal /CK. The address register 200 provides the address signal A0~A12 and BA0~BA3 to the logic circuit 100 and the address control unit 400 in synchronization with the clock signal CK or the inverted clock signal /CK.

The I/O circuit 50 provides data DQ to the memory cell array 300, or receives the data DQ from the memory cell array 300.

The logic circuit 100 includes a command decoder 110 and a mode register 120. The command decoder 110 decodes the command designated by the control signals /CS, /WE, /CAS and /RAS to generate a mode register set (MRS) command MRS_CMD and to provide the MRS command MRS_CMD to the mode register 120. The mode register 120 generates mode control signals MCS1 and MCS2 and forwards the mode control signals MCS1 and MCS2 to the address control unit 400 in response to the MRS command MRS_CMD. The first mode control signal MCS1 may be related to an operation mode of the first and second bank blocks 310 and 320 illustrated in FIG. 2. The second mode control signal MCS2 may be related to a group mode and a non-group mode of the first and second bank blocks 310 and 320 in FIG. 2.

FIG. 2 is a block diagram illustrating the memory cell array 300 and the address control unit 400 in FIG. 1 according to some exemplary embodiments.

Referring to FIG. 2, the memory cell array 300 may include the first bank block 310 and the second bank block 320. The first bank block 310 may include a plurality of banks 311~318, and the second bank block 320 may include another plurality of banks 321~328. Although the first bank block 310 is illustrated to include eight banks 311~318, the second bank block 320 is illustrated to include eight banks 321~328, and the memory cell array 300 is illustrated to include sixteen banks, the memory cell array 300 may include other quantities of banks, for example, eight banks, in some embodiments. In the case of for example, eight banks, each of the first and second bank blocks 310 and 320 may include four banks.

The address control unit 400 may include an address decoder 410, an address multiplexer 420 and a decoder unit 430. The decoder unit 430 may include a first row decoder 431, a first column decoder 432, a second row decoder 433, a second column decoder 434, a first bank decoder 435 and a second bank decoder 436. The first row decoder 431, the first column decoder 432 and the first bank decoder 435 accesses the first bank block 310. The second row decoder 433, the second column decoder 434 and the second bank decoder 436 access the second bank block 320.

The address decoder 410 decodes the address signal A0~A12 and BA0~BA3 to provide an internal address IADD. The address multiplexer 420 multiplexes the internal address IADD to provide a row address RADD, a column address CADD and a bank address BADD to the decoder unit 430.

More particularly, when the first mode control signal MCS1 designates a first operation mode, which is also referred to herein as a "non-thread mode", a same row address is provided to the first and second row decoders 431 and 433, and a same column address is provided to the first and second column decoders 432 and 434. When the first mode control signal MCS1 designates a second operation mode, which is also referred to herein as a "thread mode", individual row addresses are provided to the first and second row decoders 431 and 433, and individual column addresses are provided to the first and second column decoders 432 and 434. When the second mode control signal MCS2 designates a group mode, the first bank decoder 435 operates the first bank block 310 in the group mode, and the second bank decoder 436 operates the second bank block 320 in the group mode.

Figure 3:
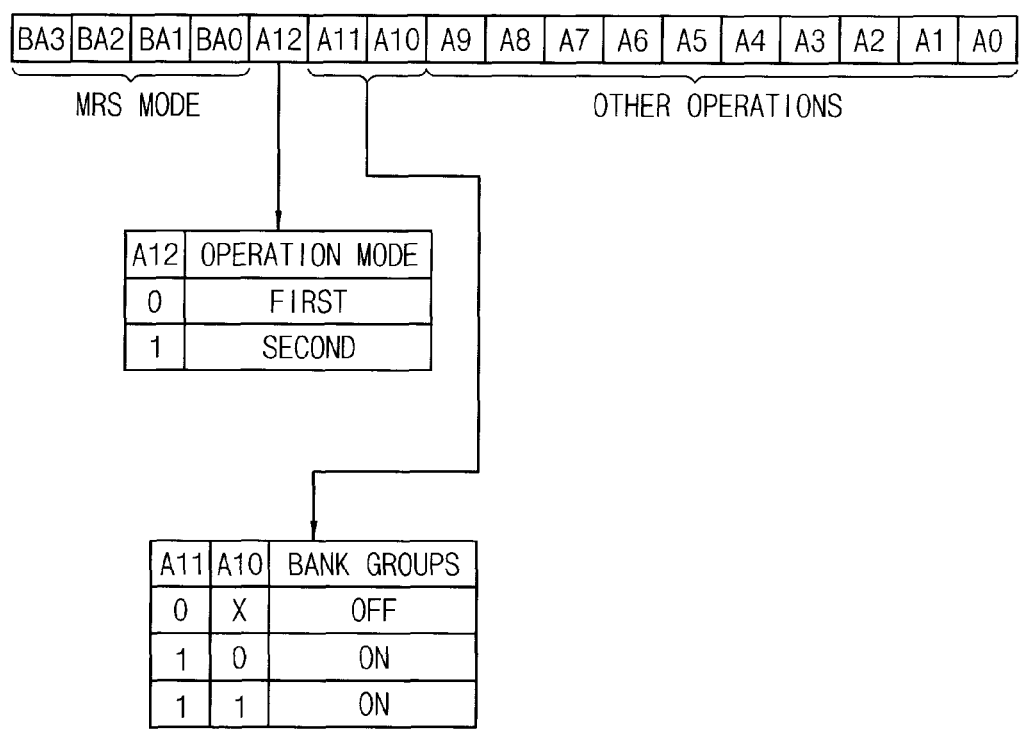
FIG. 3 is a schematic diagram which illustrates the MRS command according to some exemplary embodiments the inventive concept.

FIG. 3 illustrates the MRS command according to some exemplary embodiments.

In general, the MRS command includes an address code section A0~A12 and a bank address code section BA0~BA3. The bank address code section BA0~BA3 designates a mode of the MRS. In addition, the address code section A0~A12 designates operation codes of the mode of the MRS designated by the bank address code section BA0~BA3. The MRS command determines the first operation mode or the second operation mode based on a logic level of the address code A12. In addition, the MRS command determines the group mode or the non-group mode based on the address code A10 and A11. In addition, the address code A0~A9 designates various other operation modes such as a self-refresh mode, an internal clock mode and an RDQS mode.

For example, to illustrate the address code A12, referring to FIG. 3, when the address code A12 is in a first logic level (logic low or "0" level), the first mode control signal MCS1 designates the first operation mode. In contrast, when the address code A12 is in a second logic level (logic high or "1" level), the first mode control signal MCS1 designates the second operation mode. For example, to illustrate the address codes A10 and A11, when the address code A11 is in the first logic level, the second mode control signal MCS2 designates the non-group mode, irrespective of the address code A10. When the address code A11 is in the second logic level, the second mode control signal MCS2 designates the group mode. The logic level of the address code A10 determines a timing gap of consecutive access to the banks in the different groups.

Figure 4:
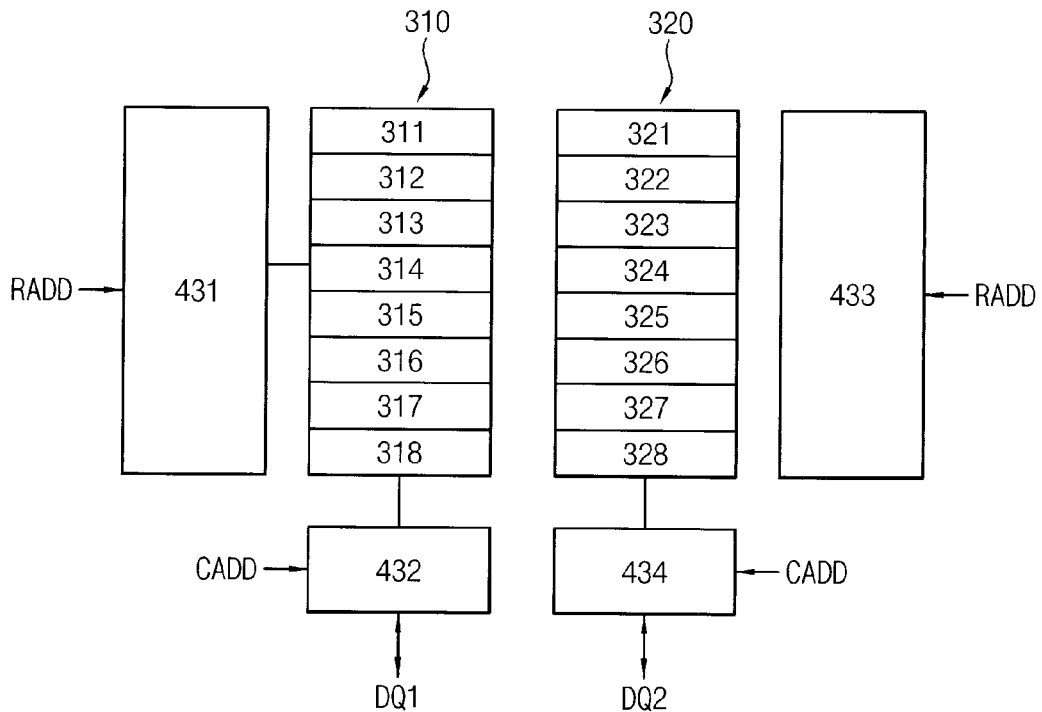
FIGS. 4 and 5 are schematic diagrams which illustrate operation of the bank blocks in FIG. 1 based on the operation mode, according to some exemplary embodiments the inventive concept. Specifically.
Figure 5:
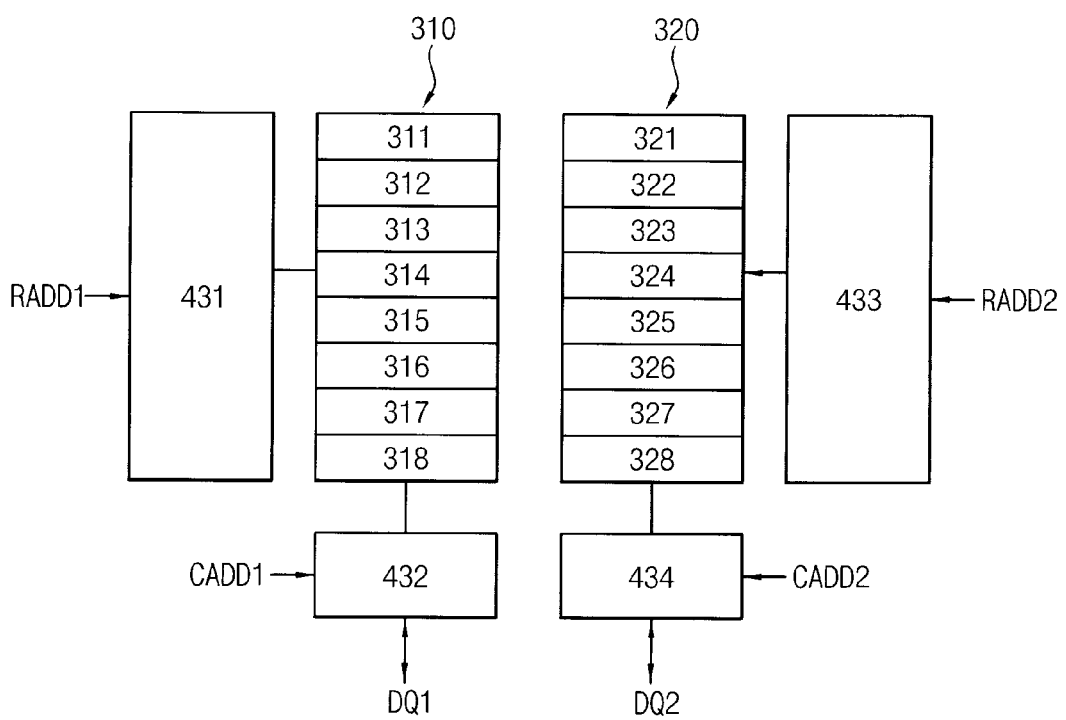

FIGS. 4 and 5 illustrate operations of the bank blocks in FIG. 1 based on the operation mode.

FIG. 4 illustrates the operation of the bank blocks 310 and 320 when the first mode control signal MCS1 designates the first operation mode.

Referring to FIG. 4, when the address code A12 is logic low level and the first mode control signal MCS1 designates the first operation mode (non-thread mode), the first row decoder 431 and the second row decoder 433 receive the same row address RADD. Similarly, the first column decoder 432 and the second column decoder 434 receive the same column address CADD. As a result of both row decoders 431, 433 receiving the same row address RADD and both column decoders 432, 434 receiving the same column address CADD, the data DQ1 and the data DQ2 are written in same locations of the first and second bank blocks 310 and 320, or the data DQ1 and the data DQ2 are read from the same locations of the first and second bank blocks 310 and 320. The first and second bank blocks 310 and 320 operate commonly in one of the non-group mode and the group mode in response to the second mode control signal MCS2.

FIG. 5 illustrates the operation of the bank blocks 310 and 320 when the first mode control signal MCS1 designates the second operation mode.

Referring to FIG. 5, when the address code A12 is logic high level and the first mode control signal MCS1 designates the second operation mode (thread mode), the first row decoder 431 receives a first row address RADD1, the second row decoder 433 receives a second row address RADD2, the first column decoder 432 receives a first column address CADD1 and the second column decoder 434 receives a second column address CADD2. As a result of the row decoders 431, 433 receiving different row addresses RADD1, RADD2, respectively, and the column decoders 432, 434 receiving different column addresses CADD1, CADD2, respectively, the data DQ1 is written to or read from a first location of the first bank blocks 310, and the data DQ2 is written to or read from a second location different from the first location, of the second bank blocks 320. The first and second bank blocks 310 and 320 can operate individually in one of the non-group mode and the group mode in response to the second mode control signal MCS2. For example, the first and second bank blocks 310 and 320 can operate respectively in the group mode or the non-group mode. For example, one of the first and second bank blocks 310 and 320 can operate in the group mode, while the other of the first and second bank blocks 310 and 320 can operate in the non-group mode.

Figures 6, 7:
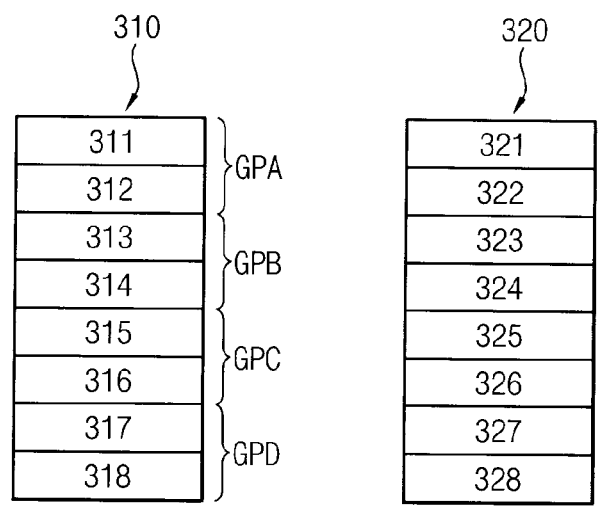
FIG. 6 is a schematic diagram which illustrates the operation of the bank blocks according to the first mode control signal and the second mode control signal, according to some exemplary embodiments of the inventive concept.
FIG. 7 is a table illustrating the address pair in the semiconductor memory device, according to some exemplary embodiments of the inventive concept.

FIG. 6 illustrates the operation of the bank blocks 310 and 320 according to the first mode control signal MCS1 and the second mode control signal MCS2.

In FIG. 6, in this illustrative example, the first mode control signal designates the second operation mode (the thread mode) such that the first and second bank blocks 310 and 320 operate individually. In this illustrative example, the second mode control signal MCS2 to the first bank block 310 designates the group mode such that the banks 311 and 312 form a first group GPA, the banks 313 and 314 form a second group GPB, the banks 315 and 316 form a third group GPC, and the banks 317 and 318 form a fourth group GPD. In this illustrative example, the second mode control signal MCS2 to the second bank block 320 designates the non-group mode such that the banks 321~328 in the second bank block 320 operate in the non-group mode. That is, when the first mode control signal MCS1 designates the second operation mode (the thread mode), the operation of the first and second bank blocks 310 and 320 may be individually controlled. That is, as described above in the illustrative example, the first bank block 310 can be operated in the group mode, and the second bank block 320 can be operated in the non-group mode.

The first mode control signal MCS1 may include one bit, and the second mode control signal MCS2 may include two bits. The table below illustrates each bit of the first and second mode control signals MCS1 and MCS2.

TABLE

| MCS1 | MCS2 | |
| --- | --- | --- |
| 0 | 0 | 0 |
|   | 1 | 1 |
| 1 | 0/1 | 0/1 |
|   | 1/0 | 0/1 |

When the first mode control signal MCS1 is logic low level, i.e., "0" level, thereby designating the first operation mode, two bits of the second mode control signal MCS2 have the same logic level such that the first and second bank blocks 310 and 320 simultaneously operate in one of the group mode and the non-group mode. When first mode control signal MCS1 is logic high level, i.e., "1" level, thereby designating the second operation mode, two bits of the second mode control signal MCS2 have the same logic levels or different logic levels. When the two bits of the second mode control signal MCS2 have different logic levels, the first bank block 310 operates in the group mode and the second bank block 320 operates in the non-group mode as illustrated in FIG. 6.

FIG. 7 is a table illustrating an address pair in the semiconductor memory device, according to some embodiments of the inventive concept. The address pair illustrated in the table of FIG. 7 includes the address signals A0~A12 and BA0~BA3. The table of FIG. 7 also lists the rising edges of the clock signal CK and the inverted clock signal /CK.

Referring to FIG. 7, the semiconductor memory device 10 receives the clock signal CK and the inverted clock signal /CK. The semiconductor memory device 10 receives the address signals BA0~BA3 and A12~A8 at the rising edge of the clock signal CK, and the semiconductor memory device 10 receives the address signals A3, A4, A5, A2, RFU (Reserved for Future Use), A6, A0, A1, A7 at the rising edge of the inverted clock signal /Ck through the same pin at which each of the address signals BA0~BA3 and A12~A8, respectively, was received. Therefore, the number of pins required is reduced, according to some embodiments of the inventive concept.

FIG. 8 is a table illustrating an addressing scheme of the semiconductor memory device of FIG. 1 according to possible density of the memory.

Referring to FIG. 8, the address signal BA0~BA2 is used as a bank address BADD in a 512M density, and address signal BA0~BA3 is used as a bank address BADD in a 1G and 2G densities. In addition, the row address RADD and the column address CADD are illustrated in each of X32 mode and X16 mode in 512M, 1G and 2G densities. The row address RADD uses address signals A0~A11 for the 512M and 1G densities, and uses address signals A0~A12 for the 2G density. The column address CADD uses address signals A0~A5 for the X32 mode in the 512M, 1G and 2G densities, and uses address signals A0~A6 for the X16 mode in the 512M, 1G and 2G densities.

FIG. 9 is a table illustrating the bank groups according to the possible density of the memory.

Referring to FIG. 9, eight banks are divided into four groups GPA, GPB, GPC and GPD, each including two banks according to the bank address BA0~BA2 in the 512M density. In addition, sixteen banks are divided into four groups GPA, GPB, GPC and GPD, each including four banks according to the bank address BA0~BA3 in the 1G and 2G densities.

Figure 10:
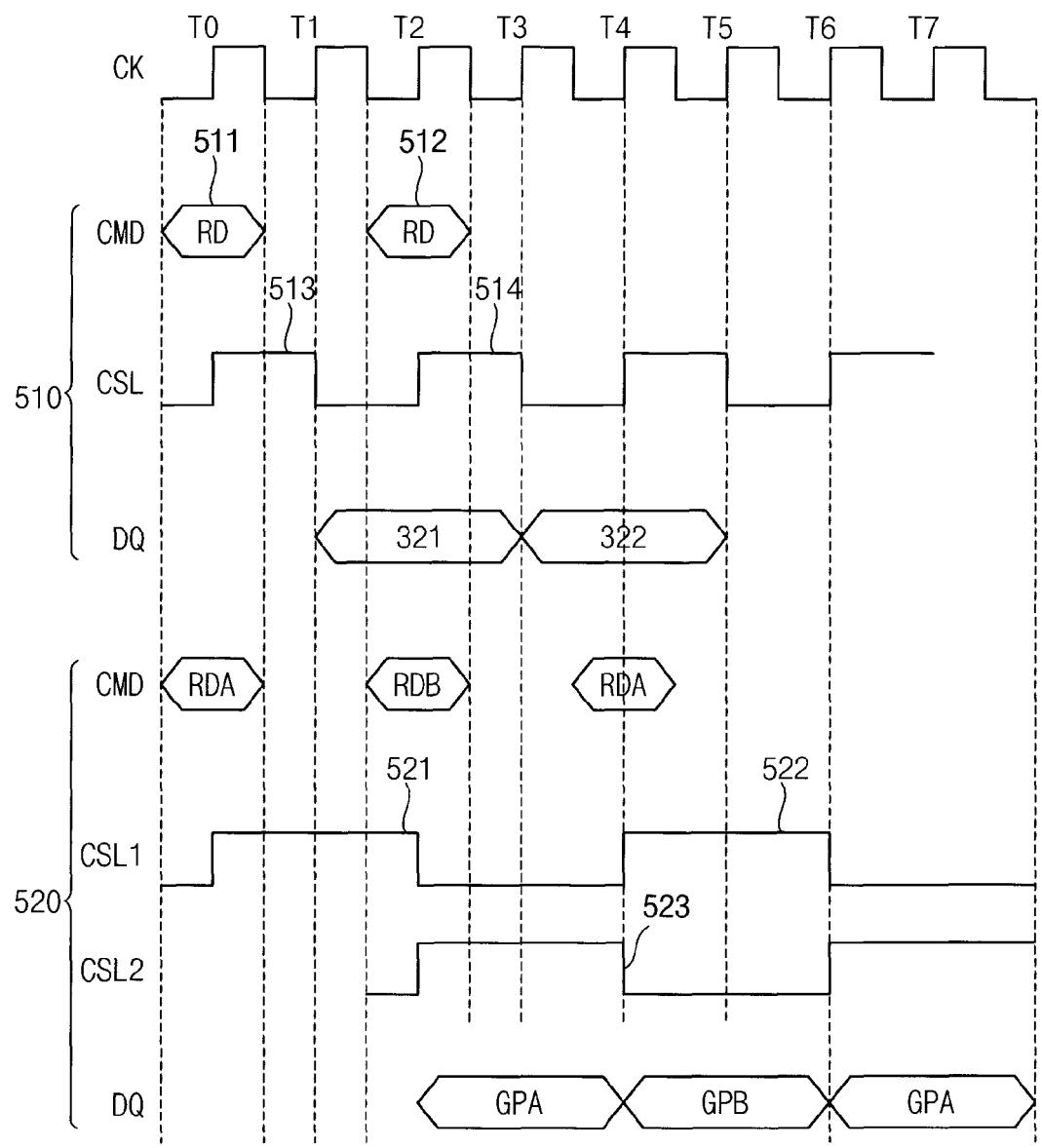
FIG. 10 is a schematic timing diagram illustrating operation of the semiconductor memory device of FIG. 1, according to some exemplary embodiments of the inventive concept.

FIG. 10 is a schematic timing diagram illustrating operation of the semiconductor memory device of FIG. 1 according to some exemplary embodiments of the inventive concept.

Operation of the semiconductor memory device 10 of FIG. 1 will be further described in detail with reference to FIGS. 1 through 6 and FIG. 10. In FIG. 10, it is assumed that the second bank block 320 operates in the non-group mode, and the first bank block 310 operates in the group mode. In addition, a reference numeral 510 is associated with a case in which the second bank block 320 operates in the non-group mode, and a reference numeral 520 is associated with a case in which the first bank block 310 operates in the group mode. In addition, in FIG. 10, signals associated with the group mode and the non-group mode are illustrated, and other signals such as active command and precharge command are not illustrated.

Referring to FIG. 10, the clock signal CK rises to logic high level at each of times T0~T7. When the second mode control signal MCS2 designates the non-group mode such that the second bank block 320 operates in the non-group mode, a read command (RD) 511 to the bank 321 is activated at time T0, and a column select signal (CSL) 513 is activated for enabling bitlines in the bank 321. Data DQ is read from the bank 321 during times T1 and T2 in response to the activated column select signal 513. After some time elapses, a read command 512 to the bank 322 is activated at time T2, and a column select signal 514 is activated for enabling bitlines in the bank 322. Data DQ is read from the bank 322 during times T3 and T4 in response to the activated column select signal 514. The period of the column select signal (CSL) for reading the data from each bank in the non-group mode is double the period of the clock signal CK. Data DQ is read from the first group GPA during times T1 and T2 in response to the activated column select signal 513.

Referring again to FIG. 10, when the second mode control signal MCS2 designates the group mode such that the second bank block 320 operates in the group mode, a read command (RDA) to the first group GPA is activated at time T0, and a column select signal (CSL1) 521 is activated for enabling bitlines in the first group GPA. Data DQ is read from the first group GPA during times T2 and T3 in response to the activated column select signal (CSL1) 521. A read command (RDB) to the second group GPB is activated at time T2, and a column select signal (CSL2) 523 is activated for enabling bitlines in the second group GPB. Data DQ is read from the first group GPB during times T5 and T6 in response to the activated column select signal (CSL2) 523. The read command (RDA) to the first group GPA is again activated at time T4, and the column select signal (CSL1) 522 is activated for enabling bitlines in the first group GPA. Data DQ is read from the first group GPA during times T6 and T7 in response to the activated column select signal (CSL1) 522. The period of the column select signals (CSL1 and CSL2) for reading the data from each bank in the group mode is four times as long as the period of the clock signal CK. That is, the period of the column select signal in the group mode is double the period of the column select signal in the non-group mode.

In addition, consecutive commands to the same bank group (the first bank group GPA in FIG. 10) may not be consecutively enabled without a time gap, and commands to the different bank groups (the first bank group GPA and the second bank group GPB in FIG. 10) may be consecutively enabled without a time gap. Therefore, the period of the column select signal in the group mode is longer than the period of the column select signal in the non-group mode. The longer period of the column select signal results in increased timing margin of the column access operation.

The timing diagram of FIG. 10 illustrates a case in which the first mode control signal MCS1 designates the second operation mode (the thread mode), the first bank block 310 operates in the group mode in response to the second mode control signal MCS2, and the second bank block 320 operates in the non-group mode in response to the second mode control signal MCS2.

Figure 11:
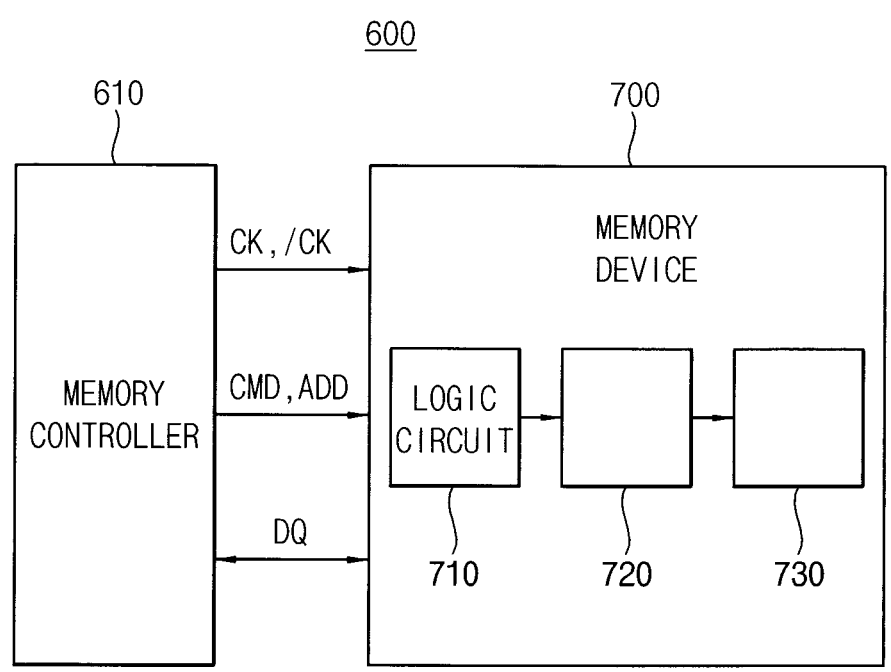
FIG. 11 is a schematic block diagram illustrating a memory system according to some exemplary embodiments of the inventive concept.

FIG. 11 is a schematic block diagram illustrating a memory system according to some exemplary embodiments of the inventive concept.

Referring to FIG. 11, a memory system 600 includes a memory controller 610 and a semiconductor memory device 700.

As part of controlling the semiconductor memory device 700, the memory controller 610 provides a command CMD, an address signal ADD, a clock signal CK and an inverted clock signal /CK to the semiconductor memory device 700. The semiconductor memory device 700 operates according to the control of the memory controller 610 and exchanges data DQ with the memory controller 610.

The semiconductor memory device 700 may include a logic circuit 710, an address control unit 720 and a memory cell array 730. The memory cell array 730 may include a plurality of banks which are divided into first and second bank blocks, as described above in detail. The logic circuit 710 controls the address control unit 720 based on the command CMD and the address signal ADD such that the first and second bank blocks commonly operate in a first operation mode, and the first and second bank blocks 310 and 320 individually operate in a second operation mode, as described above in detail. The semiconductor memory device 700 may employ the semiconductor memory device 10 of FIG. 1. Therefore, the address control unit 720 may include an address decoder, an address multiplexer and decoder unit and may control the first and second bank blocks in response to the first and second bank blocks.

FIGS. 12 to 15 illustrate examples of memory modules according to some exemplary embodiments of the inventive concept.

Figure 12:
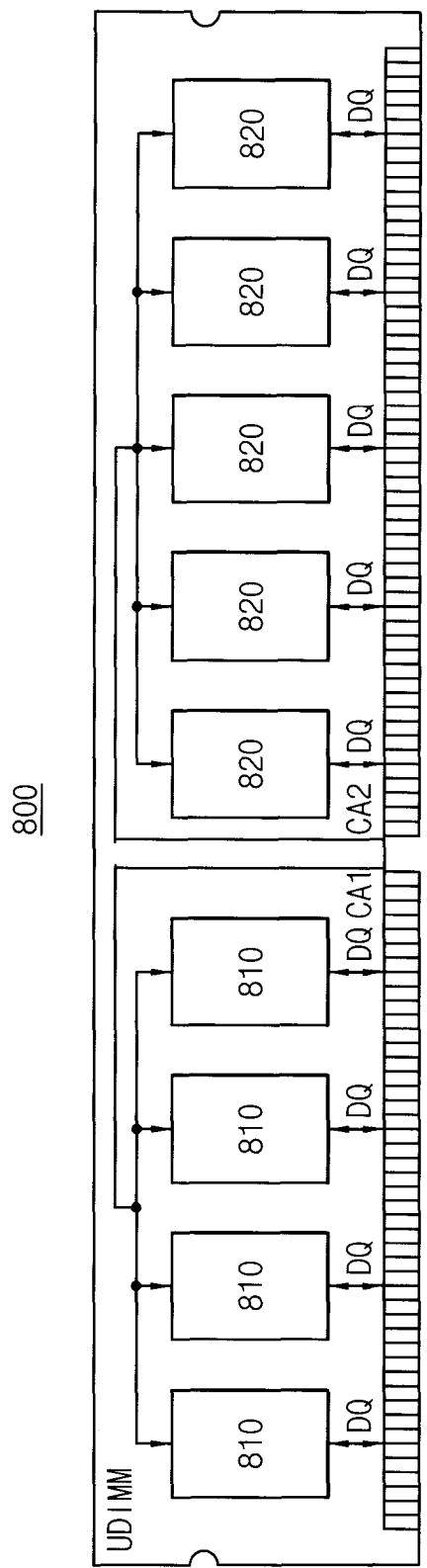
FIGS. 12 to 15 are schematic diagrams which illustrate examples of memory modules according to some exemplary embodiments of the inventive concept.

Referring to FIG. 12, a memory module 800 may be an Unbuffered Dual In-line Memory Module (UDIMM). The memory module 800 includes a plurality of semiconductor memory devices 810 and 820. Each of the semiconductor memory devices 810 and 820 exchanges data DQ externally. The semiconductor memory devices 810 may be connected to a first command/address signal line CA1 in a tree configuration, and the semiconductor memory devices 820 may be connected to a second command/address signal line CA2 in a tree configuration. Each of the semiconductor memory devices 810 and 820 may include a first bank block, a second bank block, a logic circuit and an address control unit as illustrated in FIGS. 1 and 6 and described above in detail. The semiconductor memory devices 810 receive corresponding command and address signals through the first command/address signal line CA1, and operate the first bank block and the second bank block in the first or the second operation modes, as described above in detail. The semiconductor memory devices 820 receive corresponding command and address signals through the second command/address signal line CA2, and operate the first bank block and the second bank block in the first or the second operation modes, as described above in detail. The semiconductor memory devices 810 and 820 may operate individually because the first and second command/address signal lines CA1 and CA2 are separate.

Figure 13:
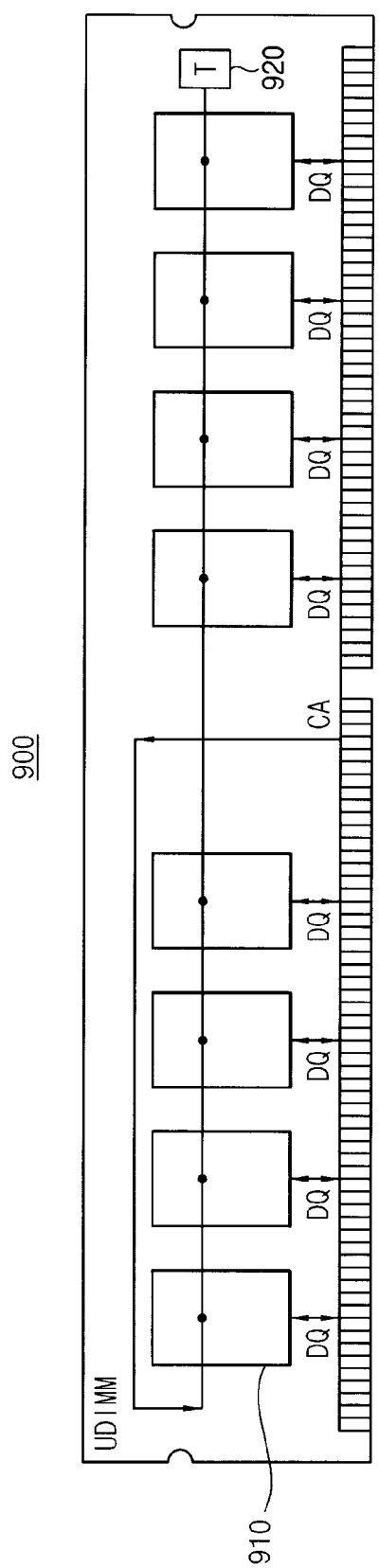

Referring to FIG. 13, a memory module 900 according to embodiments of the inventive concept may be a UDIMM. The memory module 900 includes a plurality of semiconductor memory devices 910, each exchanging data DQ externally, and a module termination resistor unit 920 connected to an end of a command/address signal line CA. The command/address signal line CA may be connected to each of the semiconductor memory devices 910 in fly-by daisy chain configuration. The semiconductor memory devices 910 may include a first bank block, a second bank block, a logic circuit and an address control unit as illustrated in FIGS. 1 to 6 and described above in detail. The semiconductor memory devices 910 may operate in first or second operation modes in response to the command and address signal, as described above in detail.

Figure 14:
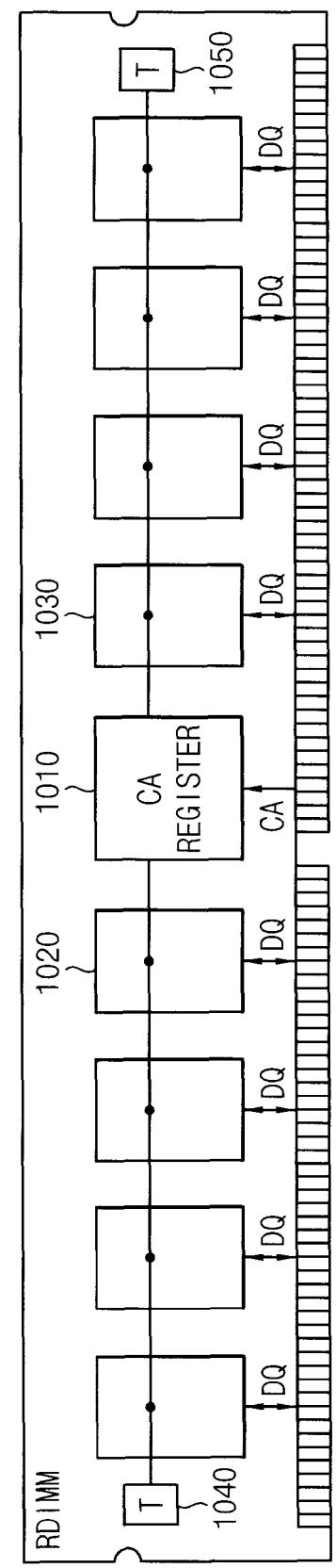

Referring to FIG. 14, a memory module 1000 according to embodiments of the inventive concept may be a Registered Dual In-line Memory Module (RDIMM). The memory module 1000 includes a plurality of semiconductor memory devices 1020 and 1030, each exchanging data DQ externally, a command/address register 1010 connected to a command/address signal line CA, and module termination resistor units 1040 and 1050 connected to an end of the command/address signal line CA. The command/address register 1010 provides a command/address signal to the semiconductor memory devices 1020 and 1030. The command/address register 1010 may be connected to the semiconductor memory devices 1020 and 1030 in a daisy chain configuration. The semiconductor memory devices 1020 and 1030 may include a first bank block, a second bank block, a logic circuit and an address control unit as illustrated in FIGS. 1 to 6 and described above in detail. The semiconductor memory devices 1020 and 1030 may operate in first or second operation modes in response to the command and address signal, as described above in detail.

Figure 15:
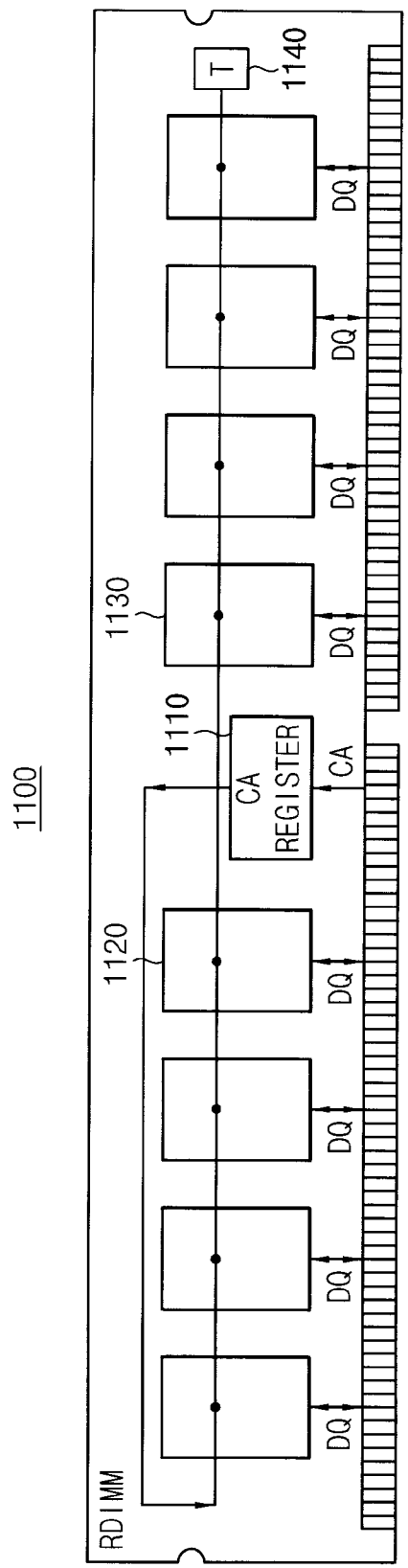

Referring to FIG. 15, a memory module 1100 according to embodiments of the inventive concept may be a Registered Dual In-line Memory Module (RDIMM). The memory module 1100 includes a plurality of semiconductor memory devices 1120 and 1130, each exchanging data DQ externally, a command/address register 1110 connected to a command/address signal line CA, and module termination resistor unit 1140 connected to an end of the command/address signal line CA. The command/address register 1110 provides a command/address signal to the semiconductor memory devices 1120 and 1130. The command/address register 1110 may be connected to the semiconductor memory devices 1120 and 1130 in a daisy chain configuration. The semiconductor memory devices 1120 and 1130 may include a first bank block, a second bank block, a logic circuit and an address control unit as illustrated in FIGS. 1 to 6 and described above in detail. The semiconductor memory devices 1120 and 130 may operate in first or second operation modes in response to the command and address signal, as described above in detail.

The semiconductor memory device according to the described embodiments may individually group the bank blocks according to the operation mode, and thus timing margin for the column access operation may be increased. Therefore, the semiconductor memory device according to the described embodiments may be employed in high speed memory devices and memory systems.

The foregoing is illustrative of exemplary embodiments and is not to be construed as limiting thereof. Although some exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A semiconductor memory device comprising:
a memory cell array including a plurality of banks, the banks being divided into a first bank block and a second bank block;
an address control unit for accessing the memory cell array; and
a logic circuit configured to control the address control unit based on a command and an address signal such that the first and second bank blocks commonly operate in a first operation mode, and the first and second bank blocks individually and simultaneously operate in a second operation mode,
wherein each of the first and second bank blocks is individually divided into at least two groups in response to the command and the address signal, and each of the first and second bank blocks operates in one of a group mode and a non-group mode in the second operation mode, and
wherein a first column access time is at least two times as long as a second column access time, and wherein the first column access time is associated with a column access time when at least one of the first and second bank blocks operates in the group mode, and the second column access time is associated with a column access time when at least one of the first and second bank blocks operates in the non-group mode.

2. The semiconductor memory device of claim 1, wherein the logic circuit controls the address control unit such that the first and second bank blocks receive a same internal address signal decoded from the address signal to operate as designated by the command in the first operation mode.

3. The semiconductor memory device of claim 1, wherein the logic circuit controls the address control unit such that the first and second bank blocks receive individual first and second internal address signals decoded from the address signal, respectively, to operate as designated by the command in the second operation mode.

4. The semiconductor memory device of claim 1, wherein each of the first and second bank blocks is divided into at least two groups in response to the command and the address signal, and the first and second bank blocks operate in one of a group mode and a non-group mode in the first operation mode, and wherein each of the first and second bank blocks is accessible in units of a group in the group mode, and each of the first and second bank blocks is accessible in units of the bank in the non-group mode.

5. The semiconductor memory device of claim 4, wherein when the first and second bank blocks operate in the group mode, each of consecutive accesses to banks in the same group is enabled by a time gap.

6. The semiconductor memory device of claim 4, wherein when the first and second bank blocks operate in the group mode, each of consecutive accesses to banks in the different groups is enabled without a time gap.

7. The semiconductor memory device of claim 1, wherein each of the first and second bank blocks is accessible in units of a group in the group mode, and each of the first and second bank blocks is accessible in units of the bank in the non-group mode.

8. The semiconductor memory device of claim 7, wherein when the first and second bank blocks operate in the group mode, each of consecutive accesses to banks in the same group is enabled by a time gap.

9. The semiconductor memory device of claim 1, wherein the logic circuit comprises:
a command decoder that decodes the command to provide a mode register set (MRS) command; and
a mode register that generates first and second mode control signals for controlling the address control unit, in response to the MRS command and the address signal.

10. The semiconductor memory device of claim 9, wherein the first mode control signal determines operation modes of the first and second bank blocks, and the second mode control signal determines group modes of the first and second bank blocks.

11. The semiconductor memory device of claim 9, wherein the mode register stores first to fourth bank address codes and first to thirteenth address codes.

12. The semiconductor memory device of claim 11, wherein the operation mode is determined according to a logic level of the thirteenth address code.

13. The semiconductor memory device of claim 11, wherein a group mode or a non-group mode of the first and second bank blocks is determined according to logic levels of the eleventh and twelfth address codes.

14. The semiconductor memory device of claim 9, wherein the address control unit comprises:
an address decoder that decodes the address signal into an internal address signal;
an address multiplexer that multiplexes the internal address signal in response to the first and second mode control signals; and
a decoder unit that accesses the first and second bank blocks according to the first and second mode control signals in response to the multiplexed internal address signal.

15. A semiconductor memory device comprising:
a memory cell array including a plurality of banks, the banks being divided into a first bank block and a second bank block;
an address control unit for accessing the memory cell array; and
a logic circuit configured to control the address control unit based on a command and an address signal such that the first and second bank blocks commonly operate in a first operation mode, and the first and second bank blocks individually and simultaneously operate in a second operation mode; wherein:
the logic circuit comprises:
a command decoder that decodes the command to provide a mode register set (MRS) command; and
a mode register that generates first and second mode control signals for controlling the address control unit, in response to the MRS command and the address signal, the mode register storing a plurality of bank address codes and a plurality of address codes; and
the address control unit comprises:
an address decoder that decodes the address signal into an internal address signal;
an address multiplexer that multiplexes the internal address signal in response to the first and second mode control signals; and
a decoder unit that accesses the first and second bank blocks according to the first and second mode control signals in response to the multiplexed internal address signal,
wherein each of the first and second bank blocks is individually divided into at least two groups in response to the command and the address signal, and each of the first and second bank blocks operates in one of a group mode and a non-group mode in the second operation mode, and
wherein a first column access time is at least two times as long as a second column access time, and wherein the first column access time is associated with a column access time when at least one of the first and second bank blocks operates in the group mode, and the second column access time is associated with a column access time when at least one of the first and second bank blocks operates in the non-group mode.

16. The semiconductor memory device of claim 15, wherein the mode register stores first to fourth bank address codes and first to thirteenth address codes.

17. The semiconductor memory device of claim 16, wherein the operation mode is determined according to a logic level of the thirteenth address code.

18. The semiconductor memory device of claim 16, wherein the group mode or the non-group mode of the first and second bank blocks is determined according to logic levels of the eleventh and twelfth address codes.

* * * * *